(12) United States Patent
Fulford et al.

(10) Patent No.: US 11,335,566 B2
(45) Date of Patent: May 17, 2022

(54) METHOD FOR PLANARIZATION OF SPIN-ON AND CVD-DEPOSITED ORGANIC FILMS

(71) Applicant: Tokyo Electron Limited, Tokyo (JP)

(72) Inventors: Daniel Fulford, Cohoes, NY (US); Jodi Grzeskowiak, Cuddebackville, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 16/784,619

(22) Filed: Feb. 7, 2020

(65) Prior Publication Data

US 2021/0020453 A1    Jan. 21, 2021

Related U.S. Application Data (60) Provisional application No. 62/876,378, filed on Jul. 19, 2019.

(51) Int. Cl.
*H01L 21/321* (2006.01)
*H01L 21/768* (2006.01)

(52) U.S. Cl.
CPC .... *H01L 21/32115* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 9,011,666 B2 * | 4/2015 | Roeger-Goepfert | ........................ H01L 21/2885 205/291 |
| 9,633,847 B2 | 4/2017 | Rathsack et al. | |
| 9,991,133 B2 | 6/2018 | Pereira et al. | |
| 10,338,466 B2 | 7/2019 | Devilliers | |
| 2005/0074907 A1 | 4/2005 | Kriz et al. | |
| 2009/0221213 A1 * | 9/2009 | Namie | ............... H01L 21/30625 451/36 |
| 2012/0028468 A1 * | 2/2012 | Cheng | ............... H01L 21/32137 438/694 |

(Continued)

FOREIGN PATENT DOCUMENTS

| KR | 10-1997-0018144 A | 4/1997 |
|---|---|---|
| KR | 10-1995-0030265 B1 | 3/1999 |

OTHER PUBLICATIONS

International Search Report and Written Opinion of the International Searching Authority dated Oct. 5, 2020 in PCT/US2020/038046, 14 pages.

(Continued)

*Primary Examiner* — Benjamin P Sandvik
(74) *Attorney, Agent, or Firm* — Oblon, McClelland, Maier & Neustadt, L.L.P.

(57) ABSTRACT

The disclosure relates to techniques and methods for planarizing a substrate by amplifying and controlling z-height technology. Variability of z-height can be modeled or measured for each device. A counter height pattern can then be created and processed on a substrate. By using different materials with different etch rates, a planarizing pattern can be transferred to the substrate or system to create a planarized substrate surface for improved lithography. Additionally, a transition region slope can be precisely controlled using the same methods.

20 Claims, 6 Drawing Sheets

(56) References Cited

U.S. PATENT DOCUMENTS

2016/0300711 A1 10/2016 Rathsack et al.
2016/0300726 A1 10/2016 Devilliers
2018/0047584 A1 2/2018 Pereira et al.

OTHER PUBLICATIONS

Korean Patent Application 1019950030265 B1 (Submitting English Abstract and English translation only) published counterpart of an unexamined publication, 3 pages.

* cited by examiner

METHOD FOR PLANARIZATION OF SPIN-ON AND CVD-DEPOSITED ORGANIC FILMS

CROSS-REFERENCE TO RELATED APPLICATIONS

This present disclosure claims the benefit of U.S. Provisional Application No. 62/876,378, filed on Jul. 19, 2019, which is incorporated herein by reference in its entirety.

TECHNICAL FIELD

The present disclosure relates to a method of fabrication of semiconductor devices and more particularly to a method for planarization of spin-on and CVD-deposited organic films.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor manufacturing includes photolithographic and patterning processes. Some photolithographic processes include coating a wafer with a thin film of bottom anti-reflective coating (BARC) material, followed by coating with a resist, and then exposing the wafer to a pattern of light as one of many process steps for creating microchips. Photolithographic and patterning processes typically benefit from a planar surface for depositing the various films and resists used to pattern and expose a wafer. Films can be specified to have a particular height and be planarized to within certain dimensions, depending on a given fabrication process.

Planarization is commonly performed using a process known as Chemical Mechanical Polishing (CMP). CMP is a process that uses corrosive chemicals and a polishing pad to planarize the surface of a wafer, similar to how wet sanding works. CMP can planarize insulators and conductors in multilevel structures. This planarization is used to stack more electronics onto another layer of a wafer, or to planarize the wafer for photo lithographic patterning. CMP is also used to fine tune the lithographic exposure process by setting a resist to a known height to optimize the exposure surface.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Although chemical mechanical polishing can provide a planar surface on a wafer, there are limitations and drawbacks to using CMP. CMP is typically executed by applying spin-on glass (SOG) on a wafer and then using corrosive chemicals and physical abrasion. Thus, CMP is a very harsh and physically abrasive process compared to other microfabrication techniques. CMP, therefore, cannot be used for many process steps of microfabricating an integrated circuit. For example, CMP cannot be used for microfabricating transistors and other front-end-of-line structures—especially when a gate oxide is exposed. Moreover, CMP processes are very expensive to run, challenging to perform, and typically reduce yield of functional integrated circuits.

Techniques disclosed herein provide methods to planarize a substrate using spin-on films and organic films deposited by chemical vapor deposition (CVD). Techniques include a method to amplify and control conventional z-height technology. Z-height varies across a wafer. This variability of z-height can be modeled or measured for each device. A counter height pattern can then be created and processed on a substrate. By using different selection of materials with some etch selectivity, a planarizing pattern can be transferred to the substrate or system to create a planarized substrate surface for improved lithography. Additionally, a transition region slope can be precisely controlled using the same process. Processes herein can be used to amplify and control other emerging z-height processing technologies.

Aspects of the disclosure provide a a method of planarization. The method includes depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the first z-height range being greater than the second z-height range; depositing a second layer on the first layer, the second layer having a top surface that is non-planar; changing a solubility of the second layer in at least one area of the top surface of the second layer to create soluble portions of the second layer; removing the soluble portions of the second layer to uncover the first layer in the first region of the substrate that includes the plurality of the structures; and simultaneously etching the first layer and the second layer such that the first layer is etched at a greater etch rate than the second layer.

In an example, when simultaneously etching the first layer and the second layer, the method further includes etching the first layer and the second layer until top surfaces of the structures are uncovered.

In another example, when simultaneously etching the first layer and the second layer, the method further includes etching the first layer and the second layer until the top surfaces of the structures are level with top surface of the first layer.

In yet another example, when simultaneously etching the first layer and the second layer, the method further includes etching the first layer and the second layer until the top surfaces of the structures are level with top surface of the first layer, and the second layer is completely removed.

In yet another example, the first layer includes a first material and the second layer includes a second material, wherein the first material has an etch rate that is different from that of the second material.

In yet another example, when changing the solubility of the second layer, the method further includes depositing a solubility-shifting agent on the second layer and diffusing the solubility-shifting agent into the second layer.

In yet another example, when changing the solubility of the second layer, the method further includes exposing the second layer to a pattern of actinic radiation that generates more solubility-shifting agent at locations of the second layer having a z-height that is greater than a z-height of other locations on the second layer.

Aspects of the disclosure also provide another method of planarization. The method includes depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the second z-height range being less than the first z-height range; depositing a second layer on the first layer, the second layer having a top surface that is non-planar and having a third z-height range over the first region of the substrate and a fourth z-height range over the second region of the substrate, the third z-height range being less than the fourth z-height range; changing a solubility of the second layer in at least one area of the top surface of the second layer to create soluble portions of the second layer; removing the soluble portions of the second layer to uncover the first layer in the first region of the substrate that includes the plurality of the structures; and simultaneously etching the first layer and the second layer such that the second layer is etched at a greater etch rate than the first layer.

Aspects of the disclosure also provide yet another method of planarization. The method includes depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the first z-height range being greater than the second z-height range; depositing a second layer on the first layer, the second layer having a top surface that is non-planar; changing a solubility of the second layer in at least one area of the top surface of the second layer to create soluble portions of the second layer; removing the soluble portions of the second layer to uncover the first layer in the first region of the substrate that includes the plurality of the structures; and simultaneously etching the first layer and the second layer such that the first layer is etched at a same etch rate than the second layer.

According to an aspect, prior to simultaneously etching the first layer and the second layer, the method further includes depositing a third layer on remaining portions of the second layer and uncovered portions of the first layer, the third layer having a top surface that is non-planar; changing a solubility of the third layer in at least one area of the top surface of the third layer to create soluble portions of the third layer; and removing the soluble portions of the third layer to uncover the first layer in the first region of the substrate that includes the plurality of the structures.

According to another aspect, prior to simultaneously etching the first layer and the second layer, the method further includes performing a cyclical planarization process of depositing additional layers on uncovered portions of the first layer in the first region of the substrate and remaining portions of at least one other layer in the second region of the substrate, and selectively removing portions of respective ones of the additional layers after each deposition of the respective ones of the additional layers until a top surface of a last one of the deposited additional layers is level with the top surface of the first layer.

Note that this summary section does not specify every aspect and/or incrementally novel aspect of the present disclosure or the claimed subject matter. Instead, this summary only provides a preliminary discussion of different aspects and corresponding points of novelty. For additional details and/or possible perspectives of the disclosure and aspects, the reader is directed to the Detailed Description section and corresponding figures of the present disclosure as further discussed below.

BRIEF DESCRIPTION OF THE DRAWINGS

The accompanying drawings, which are incorporated in and constitute a part of this specification, illustrate aspects consistent with the disclosure and, together with the description, serve to explain the principles of the disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

The following disclosure provides many different aspects, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include aspects in which the first and second features are formed in direct contact, and may also include aspects in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various aspects and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

With the onset of multiple patterning approaches, there has been an increase in the number of layers or process modules in which there exists underlying topography that affects subsequent lithographic layers. In one example, for metal definition, a method includes forming a line and space grid pattern through self-aligned double patterning (SADP) and/or self-aligned quadruple patterning (SAQP), and utilizing lithographic processes to define and memorize cuts or blocks into the metal pattern memorized into a hard-mask film. With dual damascene processing, once the metal pattern is memorized into a single or multiple hard-mask film, corresponding via patterning can be executed directly over-top this patterned, memorization film containing significant topography.

In these cases, the planarization control could be done through incorporation of some type of spin-on film, which by nature will have some marginal self-planarizing capability compared to more conformal-like depositions that would be seen through non-spin coating deposition methods. These so-called planar films can reduce the total variance of the film thickness over given topographies seen in these process modules, nevertheless, the variance reduction is not sufficient for subsequent processing. Specifically, the reduction seen is generally insufficient to maintain a flat enough surface to support advanced lithography in terms of process latitude control, specifically DOF. The planarity is also insufficient to maintain other types of non-lithography patterning processes such as etch-recessing films down to reveal (uncover) underlying patterns.

A common film which has been used extensively for this purpose has been spin-on carbon containing films. These films serve three primary purposes. One purpose is an initial planarization film for the subsequent lithography process. Another purpose is a material that has tuned n & k optical parameters that will entail absorption of light from the exposure process in a manner which reduces unwanted reflectivity. A third purpose is a transfer layer in which higher aspect ratios can be attained over conventional photoresists in which the photoresist pattern is transferred through a silicon-containing film and into the spin-on carbon film, during which the resist pattern is consumed in the etch transfer process to the spin-on carbon film. For typical ArF exposures a thickness of such commercially available spin-on carbon films can vary within a wide range, but from a reflective perspective must usually be a minimum thickness of 700 A in order to suppress any unwanted reflection.

As lithographic patterning resolution is improved through the incorporation of immersion lithography and eventually EUV lithography, there is a greater drive to control any factors driving de-focus as much as possible. This requirement is driving an increasing demand for tighter planarization control of the spin-on carbon film.

Additionally, with the onset of multiple patterning processes such as anti-spacer patterning definition, tone reversal processes, self-aligned block generation for metal layers, and self-aligned vias and contacts, there are applications in which films such as spin-on carbon can be used outside of the intended purposes discussed above as a planar light-absorbing film used as part of the lithographic process. In these patterning applications, the spin-on carbon is incorporated as a gap-filling film which is desired to equally fill a given area of pattern density equal to an area with no or little pattern density.

Techniques herein can further enhance the subject matter of U.S. Patent Application Ser. No. 62/760,622 entitled "Method for Planarization of Spin-On and CVD-Deposited Organic Films," which is herein incorporated by reference in its entirety.

Figure 1:
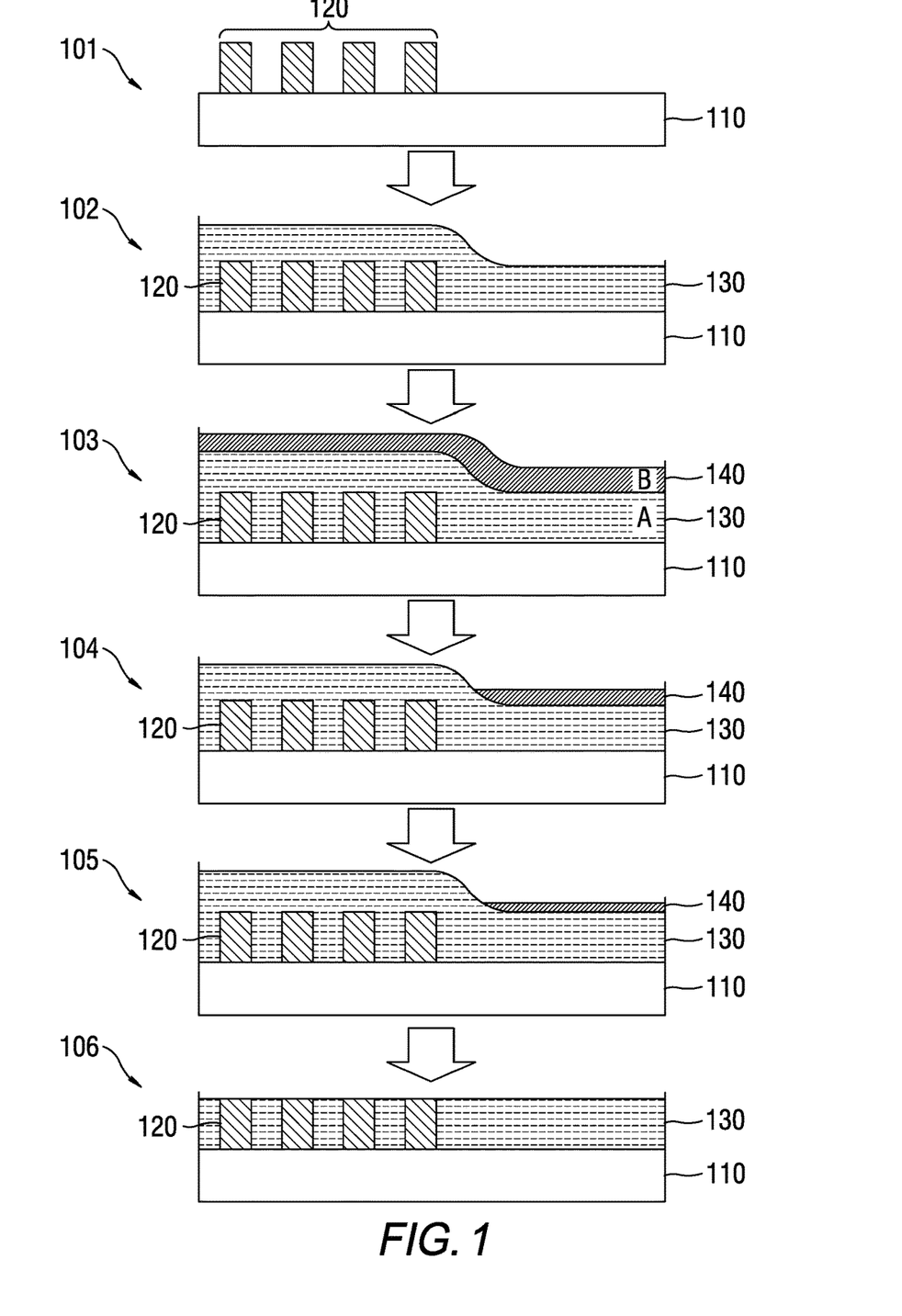
FIG. 1 shows cross-sectional formations during various steps of a planarization process according to an exemplary aspect of the present disclosure.

FIG. 1 shows cross-sectional formations during various steps of a planarization process according to an aspect of the present disclosure. As shown in formation 101 of FIG. 1, a substrate 110 may include one or more micro-fabricated structures 120 formed thereon, which results in a non-planar surface. The structures 120 may be lines, mesas or any geometry protruding from an underlying layer.

As shown in formation 102, a film may be coated or deposited on the substrate 110 to form a first layer 130 of a first material A. For example, the first layer 130 may be formed by spin-on, chemical vapor deposition (CVD), imprint, roller, tube squeeze, spray, jet print, or any suitable method of coating or depositing a film on the substrate 110. The first material A may be one or a combination of SoC, PR, SiARC, SiO, HfO, TiO, AlO, TiN, or any other suitable material. The first layer 130 can cover the substrate 110 as well as the relief pattern of the structures 120. The first layer 130 may have a top surface that is non-planar, having a relatively greater z-height over regions including the structures 120, while having a relatively lesser z-height over regions with comparatively fewer structures 120 or no structures 120. This can be a result of the isolated-dense pattern of the structures 120 on the substrate 110. Where the structures 120 are densely formed on the substrate 110, this density may push up certain coatings. In areas with more isolated structures 220 or no structures 220 the coating may drop. This is illustrated in formation 102 of FIG. 1.

As shown in formation 103, a second layer 140 of a second material B may then be deposited on the first layer 130. For example, the second layer 140 may be formed by spin-on, chemical vapor deposition (CVD), imprint, roller, tube squeeze, spray, jet print, or any suitable method of coating or depositing a film on the first layer 130. The second material B may be one or a combination of Acid Sensitive Polymer PTD PR, Acid Sensitive Polymer NTD PR, Acid Sensitive Polymer DARC, Acid Sensitive Polymer DBARC, Acid Sensitive monomer acid catalyst crosslinking (H+), or any other suitable material. The second layer 140 may have a top surface that is non-planar. Material A of the first layer 130 and material B of the second layer 140 may be selected to directly amplify a magnitude of z-height control. For example, the materials can be selected so that material A has a greater etch rate compared to material B.

A chemical planarization process may then be performed that changes a solubility of the second layer 140 at certain locations. This can include a top down diffusion of a photo acid generator or other solubility-changing agent, as well as patterned exposure of actinic radiation. For example, an acid may be coated on the second layer 140. This may be followed by a patterned exposure of light to activate the acid over areas with greater z-height. Then a bake step may drive the acid down through the second layer 140, making the affected portion of the second layer 140 soluble to a particular developer or solvent. The soluble top portion of the second layer 140 may then be removed. This uncovers regions of the first layer with a greater z-height, as shown in formation 104 of FIG. 1.

An etch process may then be performed using an etch chemistry that simultaneously etches the first material A of the first layer 130 and the second material B of the second layer 140. This etch process may also etch the first material A at a greater etch rate compared to a rate of etching the second material B. This etch rate differential allows uncovered regions of the first material A to be etched faster. This is beneficial when the first material A is thicker than the second material B, as shown in formation 105 of FIG. 1.

After continued etching of the first layer 130 and the second layer 140, both of the layers 130, 140 may be etched down to top surfaces of the structures 120, thereby resulting in a planar surface, as shown in formation 106 of FIG. 1. The second layer 140 to be removed is essentially thinner than the portion of the first layer 130 to be removed. The different thicknesses to be etched coupled with the different etching rates enable a final result to be a planar surface where desired, such as at top surfaces of the micro-fabricated structures 120.

Figure 2:
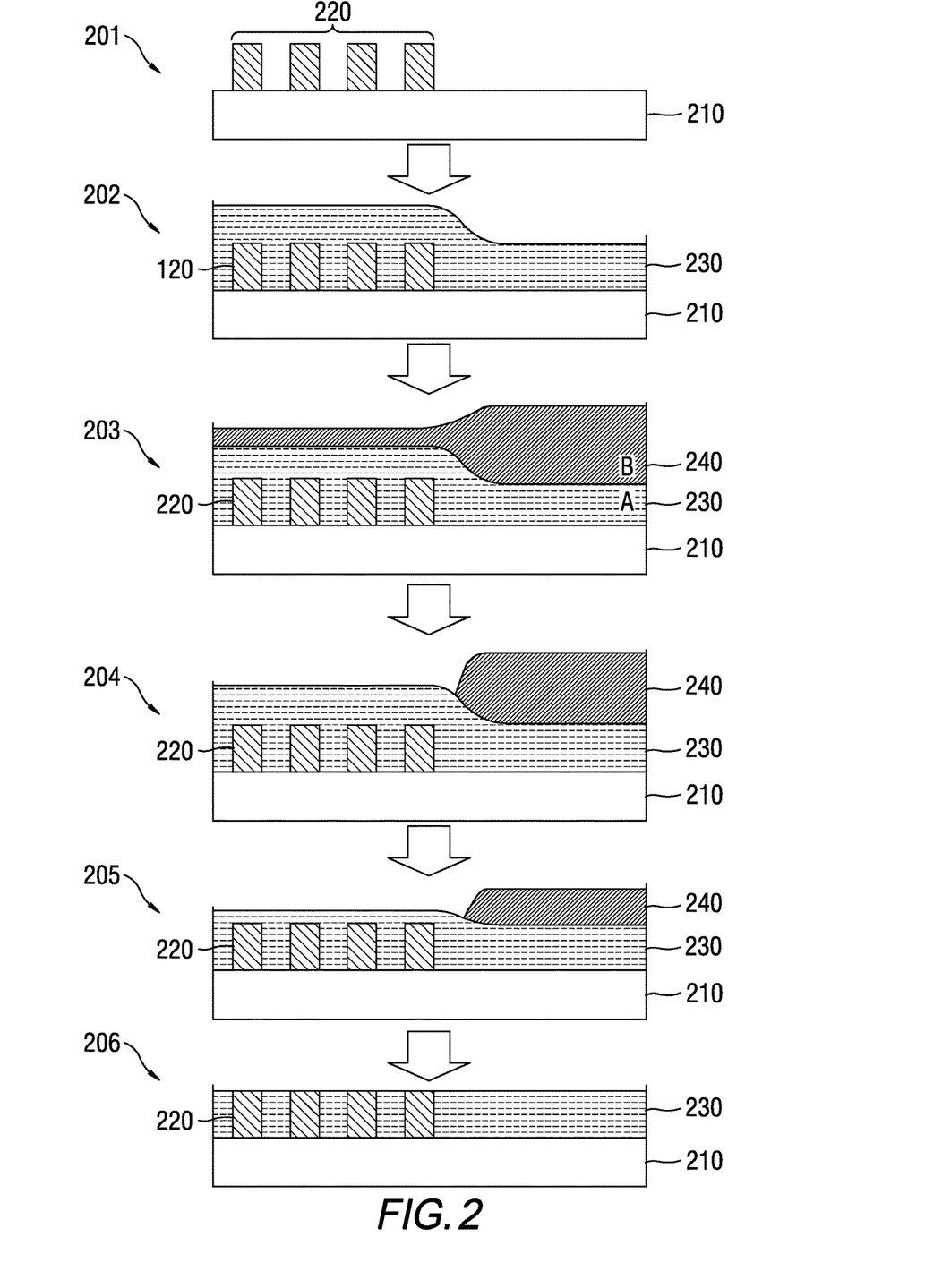
FIG. 2 shows cross-sectional formations during various steps of a planarization process according to another exemplary aspect of the present disclosure.

FIG. 2 shows cross-sectional formations during various steps of a planarization process according to another aspect of the present disclosure. As shown in formation 201 of FIG. 2, a substrate 210 may include one or more micro-fabricated structures 220 formed thereon, which results in a non-planar surface. The substrate 210 may have a relief pattern of the structures 220 with some isolated regions with no structures 220 or few of the structures 220, and some dense regions with many of the structures 220. The structures 220 may be lines, mesas or any geometry protruding from an underlying layer.

As shown in formation 202, a film may be coated or deposited on the substrate 210 to form a first layer 230 of the first material A. Coating can be executed by spin-on or chemical vapor deposition. The first layer 230 can cover the substrate 210 as well as the relief pattern of structures 220. The first layer 230 may have a top surface that is non-planar, having relatively greater z-height over regions including the structures 220, while having relatively lesser z-height over regions with comparatively fewer or no structures 220. This can be a result of the isolated-dense pattern of the structures 220 on the substrate 210. Where the structures 220 are densely formed on the substrate 210, this density may push up certain coatings. In areas with more isolated structures 220 or no structures 220 the coating may drop. This is illustrated in formation 202 of FIG. 2.

As shown in formation 203, a second layer 240 of the second material B may then be deposited on the first layer 230. The second layer 240 may have a top surface that is non-planar with greater z-height over regions with comparatively fewer structures 220 or no structures 220 from the relief pattern of the substrate 210.

A chemical planarization process may be performed that changes a solubility of the second layer 240 at certain locations. This can include a top down diffusion of a photo acid generator or other solubility-changing agent, as well as patterned exposure of actinic radiation. For example, an acid is coated on the second layer 240. This is followed by a patterned exposure of light to activate the acid over areas with greater z-height of the first layer 230. Then a bake step drives the acid down through the second layer 240, making the affected portion of the second layer 240 soluble to a particular developer or solvent. The soluble top portion of the second layer 240 may then be removed. This uncovers regions of the first layer 230 with a greater z-height, while leaving the second layer 240 with a relatively greater thickness to be removed, as shown in formation 204 of FIG. 2.

An etch process may then be performed using an etch chemistry that simultaneously etches the first material A of the first layer 230 and the second material B of the second layer 240. This etch process may also etch the first material A at a lesser etch rate compared to a rate of etching the second material B. This etch rate differential allows uncovered regions of the first material A to be etched slower. This is beneficial when the first material A is thinner than the second material B, as shown in formation 205 of FIG. 2.

After continued etching of the first layer 230 and the second layer 240, both of the layers 230, 240 may be etched down to top surfaces of the structures 220, thereby resulting in a planar surface, as shown in formation 206 of FIG. 2. The second layer 240 of the second material B to be removed is essentially thicker than the portion of the first layer 230 of the first material A to be removed. The different thicknesses to be etched coupled with the different etching rates enable a final result to be a planar surface where desired, such as at top surfaces of the micro-fabricated structures 220.

Figure 3:
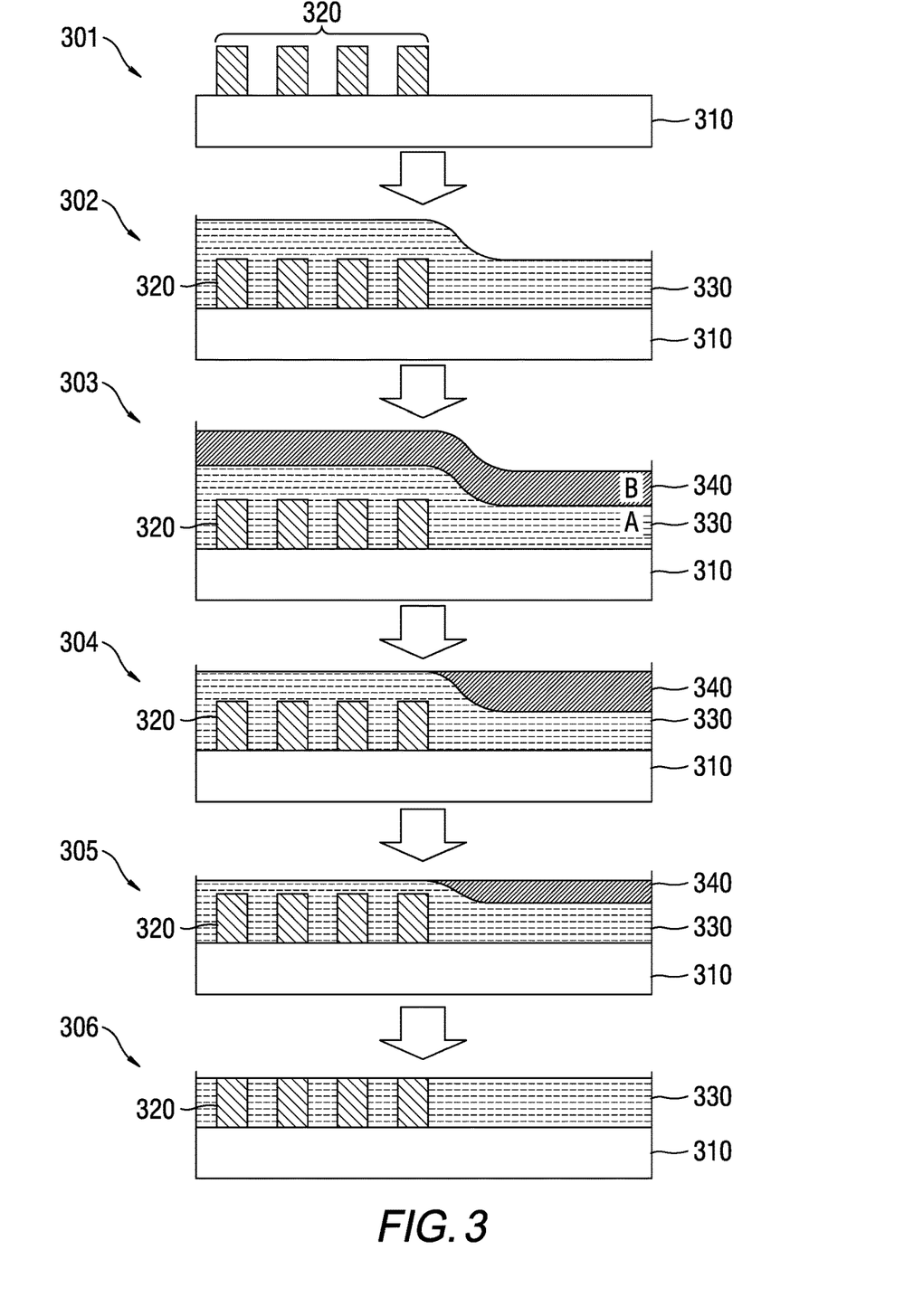
FIG. 3 shows cross-sectional formations during various steps of a planarization process according to yet another exemplary aspect of the present disclosure.

FIG. 3 shows cross-sectional formations during various steps of a planarization process according to yet another aspect of the present disclosure. As shown in formation 301 of FIG. 3, a substrate 310 may include one or more micro-fabricated structures 320 formed thereon, which results in a non-planar surface. The substrate 310 may have a relief pattern of the structures 320 with some isolated regions with no structures 320 or few of the structures 320, and some dense regions with many of the structures 320. The structures 320 may be lines, mesas or any geometry protruding from an underlying layer.

As shown in formation 302, a film may be coated or deposited on the substrate 310 to form a first layer 330 of the first material A. Coating can be executed by spin-on or chemical vapor deposition. The first layer 330 can cover the substrate 310 as well as the relief pattern of the structures 320. The first layer 330 may have a top surface that is non-planar, having relatively greater z-height over regions including the structures 320, while having relatively lesser z-height over regions with comparatively fewer or no structures 320. This can be a result of the isolated-dense pattern of the structures 320 on the substrate 310. Where the structures 320 are densely formed on the substrate 310, this density may push up certain coatings. In areas with more isolated structures 320 or no structures 320 the coating may drop. This is illustrated in formation 302 of FIG. 3.

As shown in formation 303, a second layer 340 of the second material B may then be deposited on the first layer 330. The second layer 340 may have a top surface that is non-planar. Material A of the first layer 330 and material B of the second layer 340 may be selected to directly amplify a magnitude of z-height control. For example, the materials can be selected so that material A has a greater etch rate compared to material B.

A chemical planarization process may then be performed that changes a solubility of the second layer 340 at certain locations. This can include a top down diffusion of a photo acid generator or other solubility-changing agent, as well as patterned exposure of actinic radiation. For example, an acid may be coated on the second layer 340. This may be followed by a patterned exposure of light to activate the acid over areas with greater z-height. Then a bake step may drive the acid down through the second layer 340, making the affected portion of the second layer 340 soluble to a particular developer or solvent. The soluble top portion of the second layer 340 may then be removed. This uncovers regions of the first layer 330 with a greater z-height, as shown in formation 304 of FIG. 3. This results in approximately equivalent thickness of the first material A of the first layer 330 and the second material B of the second layer 340 to be removed above the top surfaces of the structures 320.

An etch process may then be performed using an etch chemistry that simultaneously etches the first material A of the first layer 330 and the second material B of the second layer 340. This etch process may also etch both the first material A and the second material B at a same rate. With each material having an equivalent thickness, both materials can be etched at the same rate to result in a planar surface stopping above the top surfaces of the structures 320, as shown in formation 305 of FIG. 3.

After continued etching of the first layer 330 and the second layer 340, both of the layers 330, 340 may be etched down to the top surfaces of the structures 320, thereby resulting in a planar surface, as shown in formation 306 of FIG. 3. The second layer 340 was deposited to have a final thickness above the isolated regions of few or no structures 320 equal to a thickness of the first layer 320 above the dense regions of the structures 320.

Figure 4A:
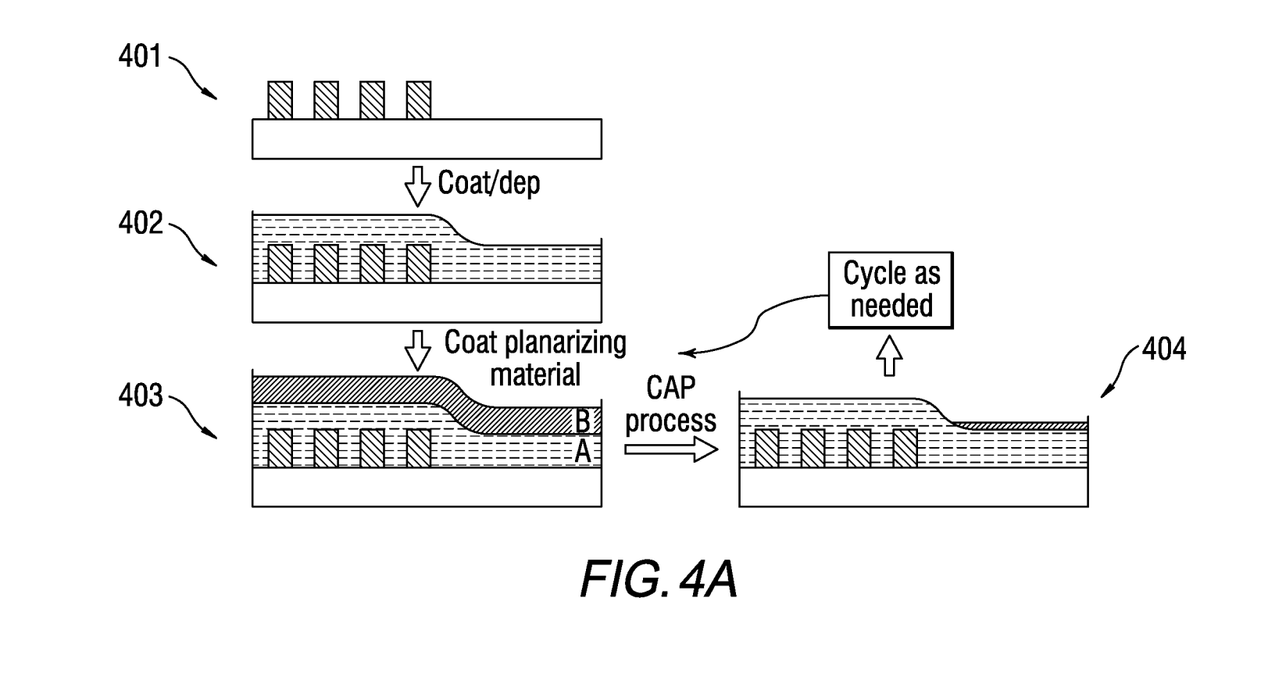
FIG. 4A shows cross-sectional formations during various steps in a cyclical planarization process according to an exemplary aspect of the present disclosure.

FIG. 4A shows cross-sectional formations during various steps in a cyclical planarization process 400 according to an aspect of the present disclosure. Formations 401, 402, 403, 404 and their respective features shown in FIG. 4A may, for example, correspond to the formations 101, 102, 103, 104 and their respective features shown in FIG. 1. In this cyclical planarization process 400, the deposition of layers (e.g., the second layer 140), as well as the selective location-based solubility and development steps may be cycled to achieve a desired result, such as that shown in FIG. 4B. Any one or combination of the aspects of the planarization processes and the respective formations described with reference to FIGS. 1, 2 and 3 may be used in the cyclical planarization process 400.

Figure 4B:
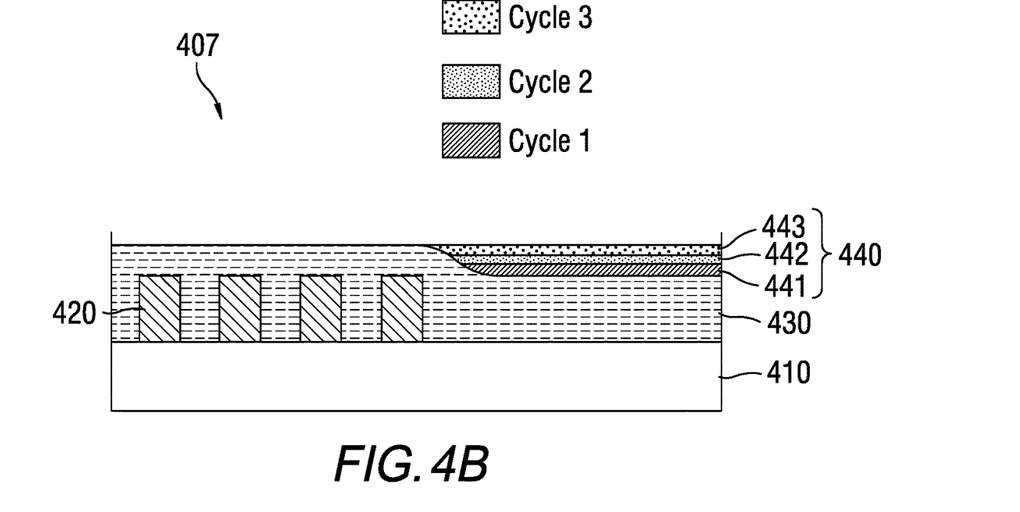
FIG. 4B shows a cross-sectional formation after completion of multiple cycles of the cyclical planarization process according to an exemplary aspect of the present disclosure.

FIG. 4B shows a cross-sectional formation 407 after completion of multiple cycles of the cyclical planarization process 400 shown in FIG. 4A. The formation 407 may include a substrate 410, structures 420, and a first layer 430 that may correspond to the substrate 110, the structures 120, and the first layer 130 shown in FIG. 1, as well as the corresponding features shown in FIGS. 2 and 3. With respect to second layer 440, FIG. 4B shows how several cycles of material deposition and removal in accordance with the aforementioned aspects can be combined to result in a second layer 440 of a desired thickness. The second layer 440 may include a first cycle layer 441, a second cycle layer 442, and a third cycle layer 443, which may be deposited during a first cycle, a second cycle, and a third cycle, respectively, of the cyclical planarization process 400. The second layer 440 may include fewer or more layers than shown in FIG. 4B based on a number of cycles performed by the cyclical planarization process 400. Furthermore, each of the cycle layers may include the same or different materials (e.g., any one or a combination of SoC, PR, SiARC, SiO, HfO, TiO, AlO, TiN, Acid Sensitive Polymer PTD PR, Acid Sensitive Polymer NTD PR, Acid Sensitive Polymer DARC, Acid Sensitive Polymer DBARC, Acid Sensitive monomer acid catalyst crosslinking (H+)) and may have the same or different thicknesses relative to one another.

Figure 5:
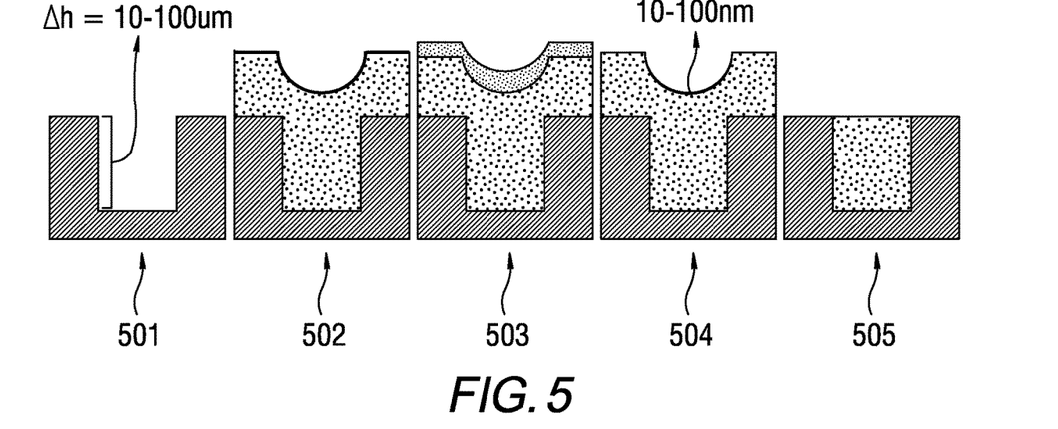
FIG. 5 shows cross-sectional formations of planarization processes for different scales according to an exemplary aspect of the present disclosure.

FIG. 5 shows cross-sectional formations of planarization processes for different scales according to an aspect of the present disclosure. Specifically, formations 501, 502, 503, 504 and 505 show how adjustments can be made depending on a scale of planarization. For example, aspects of the disclosed planarization process may be used on the nanometer scale, such as with height differences in the 10-100 nanometer range, as shown in formation 504. Aspects of the disclosed planarization process may also be used for planarizing layers with height differentials in the micron scale, such as with height differences in the 10-100 micrometer range, as shown in formation 501. Aspects of the disclosed planarization process may also be used to planarize height differentials less than 100 nm, less than 10 microns, or greater than a micron.

In view of the aforementioned description, the disclosed planarization process can be used for effectively planarizing substrates, films, and layers of various materials using a combination of location-based development and etch rate differentials, without using any mechanical abrasion.

Figure 6:
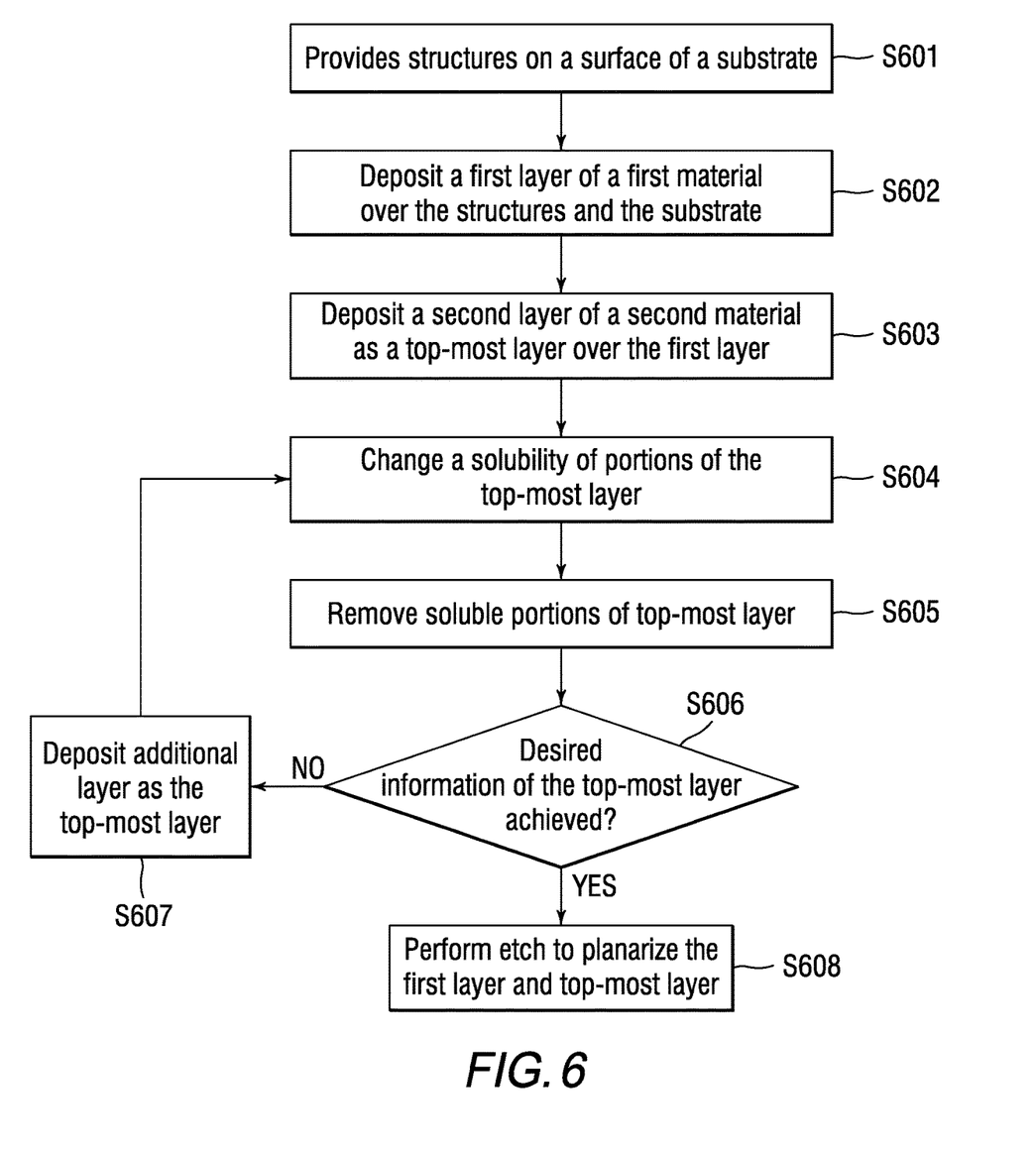
FIG. 6 shows a flow chart for a method of planarization according to an exemplary aspect of the present disclosure.

FIG. 6 shows a flow chart for a method of planarization according to an exemplary aspect of the present disclosure. In step S601, structures are provided on a surface of a substrate. For example, as shown in FIGS. 1-3, the structures 120, 220, 320 may be formed on the substrates 110, 210, 310, respectively.

In step S602, a first layer of a first material is deposited over the substrate and the structures. For example, as shown in FIGS. 1-3, the first layers 130, 230, 330 may be formed on the substrates 110, 210, 310, respectively, so as to cover both the respective substrates 110, 210, 310 and the structures 120, 220, 320 thereon. The first layer forms a non-planar surface above the substrate based on the relief pattern of the underlying structures 120, 220, 320. The first material may be the first material A, such as SoC, PR, SiARC, SiO, HfO, TiO, AlO, TiN, or any other suitable material.

In step S603, a second layer of a second material is deposited as a top-most layer over the first layer. For example, as shown in FIGS. 1-3, the second layers 140, 240, 340 may be formed on the first layers 130, 230, 330, respectively. The second material may be the second material B, such as Acid Sensitive Polymer PTD PR, Acid Sensitive Polymer NTD PR, Acid Sensitive Polymer DARC, Acid Sensitive Polymer DBARC, Acid Sensitive monomer acid catalyst crosslinking (H+), or any other suitable material. Furthermore, the second layer may be deposited in a manner so as to have a non-planer top surface that varies in z-height over regions of the first layer in the manner described with reference to FIGS. 1-3.

In step S604, a solubility of portions of the top-most layer or the most recently deposited layer, such as the second layer, may be changed. For example, as shown in FIGS. 1-3, the solubility of the second material B of the second layers 140, 240, 340 may be changed by a chemical planarization process at certain locations. The location of the top-most layer (e.g., the second layer) that are changed in solubility may vary based on the desired resultant formation and thickness of the top-most layer relative to the first layer.

In step S605, the portions of the top-most layer that had been changed in solubility by the chemical planarization process (i.e., the soluble portions) are then removed. For example, as shown in FIGS. 1-3, various soluble portions of the second layers 140, 240, 340 may be removed to uncover regions of the first layers 130, 230, 330, respectively. The specific portions of the top-most layer that are removed and the specific regions of the first layer that are exposed may be controlled based on the desired resultant formation and thickness and z-height of the top-most layer relative to the first layer, as exemplified in the formations 104, 204, 304 shown in FIGS. 1-3. The timing and intensity of the removal process may also be controlled to achieve the desired result.

In step S606, it is determined whether the desired formation of the top-most layer had been achieved by the chemical planarization and removal process in step S605. If the desired formation had been achieved, then the method proceeds to step S608. Otherwise, if the desired formation had not been achieved, then the process proceeds to step S607, leading to the cyclical planarization process 400, as described with reference to FIGS. 4A-4B.

In step S607, an additional layer is deposited as the new top-most layer over the exposed regions of the first layer and the remaining portions of the second layer (i.e., the previously formed, processed, and partially removed top-most layer). The process then proceeds through steps S604, S605, S606, as a part of a cycle of the cyclical planarization process 400 until the desired formation of the top-most layer is achieved. For example, as shown in FIGS. 4A-4B, the cyclical planarization process 400 progresses from step S607 and back through steps S604, S605, S606, to deposit, develop, and remove an additional one or more of the cycle layers 441, 442, 443 to achieve a desired formation result, such as that shown in FIG. 4B.

In step S608, once the desired formation is achieved, an etch is performed to planarize the first layer and the top-most layer to obtain a planar surface at a desired level. For example, as shown in FIGS. 1-3 a chemical etch may continuously etch the first material A of the first layer and the second material B of the second layer at appropriate respective etch rates relative to each other to obtain a final formation having a planar surface where desired (e.g., at a level that exposes the top surface of the structures 120, 220, 320). The etch rate differential between the first and second materials is controlled based on the type of materials and the respective thicknesses of the first and top-most layers. An example of the etch differential is shown in the progression from formation 104 to formation 106 in FIG. 1, from formation 204 to formation 206 in FIG. 2, and from formation 1304 to formation 306 in FIG. 3.

In this manner, the disclosed method of planarization can be used for effectively planarizing substrates, films, and layers of various materials using a combination of location-based development and etch rate differentials, while avoiding harsh and physically abrasive processes.

In the preceding description, specific details have been set forth, such as a particular geometry of a processing system and descriptions of various components and processes used therein. It should be understood, however, that techniques herein may be practiced in other aspects that depart from these specific details, and that such details are for purposes of explanation and not limitation. Aspects disclosed herein have been described with reference to the accompanying drawings. Similarly, for purposes of explanation, specific numbers, materials, and configurations have been set forth in order to provide a thorough understanding. Nevertheless, aspects may be practiced without such specific details. Components having substantially the same functional constructions are denoted by like reference characters, and thus any redundant descriptions may be omitted.

Various techniques have been described as multiple discrete operations to assist in understanding the various aspects. The order of description should not be construed as to imply that these operations are necessarily order dependent. Indeed, these operations need not be performed in the order of presentation. Operations described may be performed in a different order than the described aspect. Various additional operations may be performed and/or described operations may be omitted in additional aspects.

"Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of aspects of the disclosure are not intended to be limiting. Rather, any limitations to aspects of the disclosure are presented in the following claims.

What is claimed is:

1. A method of planarization, comprising:
depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the first z-height range being greater than the second z-height range;
depositing a second layer on the first layer, the second layer having a top surface that is non-planar;
changing a solubility of the second layer in at least one area of the top surface of the second layer to create soluble portions of the second layer;
removing the soluble portions of the second layer to uncover the first layer in the first region of the substrate that includes the plurality of the structures; and
simultaneously etching the first layer and the second layer such that the first layer is etched at a greater etch rate than the second layer.

2. The method of claim 1, wherein simultaneously etching the first layer and the second layer includes etching the first layer and the second layer until top surfaces of the structures are uncovered.

3. The method of claim 2, wherein simultaneously etching the first layer and the second layer further includes etching the first layer and the second layer until the top surfaces of the structures are level with top surface of the first layer.

4. The method of claim 2, wherein simultaneously etching the first layer and the second layer further includes etching the first layer and the second layer until the top surfaces of the structures are level with top surface of the first layer, and the second layer is completely removed.

5. The method of claim 1, wherein the first layer includes a first material and the second layer includes a second material, wherein the first material has an etch rate that is different from that of the second material.

6. The method of claim 1, wherein changing the solubility of the second layer includes depositing a solubility-shifting agent on the second layer and diffusing the solubility-shifting agent into the second layer.

7. The method of claim 1, wherein changing the solubility of the second layer includes exposing the second layer to a pattern of actinic radiation that generates more solubility-shifting agent at locations of the second layer having a z-height that is greater than a z-height of other locations on the second layer.

8. A method of planarization, comprising:
depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the second z-height range being less than the first z-height range;
depositing a second layer on the first layer, the second layer having a top surface that is non-planar and having a third z-height range over the first region of the substrate and a fourth z-height range over the second region of the substrate, the third z-height range being less than the fourth z-height range;
changing a solubility of the second layer in at least one area of the top surface of the second layer to create soluble portions of the second layer;
removing the soluble portions of the second layer to uncover the first layer in the first region of the substrate that includes the plurality of the structures; and
simultaneously etching the first layer and the second layer such that the second layer is etched at a greater etch rate than the first layer.

9. The method of claim 8, wherein simultaneously etching the first layer and the second layer includes etching the first layer and the second layer until top surfaces of the structures are uncovered.

10. The method of claim 9, wherein simultaneously etching the first layer and the second layer further includes etching the first layer and the second layer until the top surfaces of the structures are level with top surface of the first layer.

11. The method of claim 9, wherein simultaneously etching the first layer and the second layer further includes etching the first layer and the second layer until the top surfaces of the structures are level with top surface of the first layer, and the second layer is completely removed.

12. The method of claim 8, wherein changing the solubility of the second layer includes depositing a solubility-shifting agent on the second layer and diffusing the solubility-shifting agent into the second layer.

13. The method of claim 8, wherein changing the solubility of the second layer includes exposing the second layer to a pattern of actinic radiation that generates more solubility-shifting agent at locations of the second layer having a z-height that is less than a z-height of other locations on the second layer.

14. A method of planarization, comprising:
depositing a first layer on a substrate having a relief pattern of structures, the first layer covering the substrate and the structures, a top surface of the first layer being non-planar and having a first z-height range over a first region of the substrate that includes a plurality of the structures and a second z-height range over a second region of the substrate that includes fewer structures than the plurality of the structures in the first region, the first z-height range being greater than the second z-height range;
depositing a second layer on the first layer, the second layer having a top surface that is non-planar;
changing a solubility of the second layer in at least one area of the top surface of the second layer to create soluble portions of the second layer;
removing the soluble portions of the second layer to uncover the first layer in the first region of the substrate that includes the plurality of the structures; and
simultaneously etching the first layer and the second layer such that the first layer is etched at a same etch rate than the second layer.

15. The method of claim 14, wherein simultaneously etching the first layer and the second layer includes etching the first layer and the second layer until top surfaces of the structures are uncovered.

16. The method of claim 15, wherein simultaneously etching the first layer and the second layer further includes etching the first layer and the second layer until the top surfaces of the structures are level with top surface of the first layer.

17. The method of claim 14, wherein changing the solubility of the second layer includes depositing a solubility-shifting agent on the second layer and diffusing the solubility-shifting agent into the second layer.

18. The method of claim 14, wherein removing the soluble portions of the second layer results in remaining portions of the second layer being level with uncovered portions of the first layer.

19. The method of claim 14, wherein prior to simultaneously etching the first layer and the second layer, the method further comprises:
depositing a third layer on remaining portions of the second layer and uncovered portions of the first layer, the third layer having a top surface that is non-planar;
changing a solubility of the third layer in at least one area of the top surface of the third layer to create soluble portions of the third layer; and
removing the soluble portions of the third layer to uncover the first layer in the first region of the substrate that includes the plurality of the structures.

20. The method of claim 14, wherein prior to simultaneously etching the first layer and the second layer, the method further comprises:
performing a cyclical planarization process of depositing additional layers on uncovered portions of the first layer in the first region of the substrate and remaining portions of at least one other layer in the second region of the substrate, and selectively removing portions of respective ones of the additional layers after each deposition of the respective ones of the additional layers until a top surface of a last one of the deposited additional layers is level with the top surface of the first layer.

* * * * *

UNITED STATES PATENT AND TRADEMARK OFFICE
CERTIFICATE OF CORRECTION

PATENT NO. : 11,335,566 B2
APPLICATION NO. : 16/784619
DATED : May 17, 2022
INVENTOR(S) : Fulford et al.

It is certified that error appears in the above-identified patent and that said Letters Patent is hereby corrected as shown below:

On the Title Page

Column 2, Item (56), under "OTHER PUBLICATIONS", Line 1, delete "ofthe" and insert -- of the --, therefor.

Signed and Sealed this
Eighteenth Day of October, 2022

Katherine Kelly Vidal
*Director of the United States Patent and Trademark Office*